(12) United States Patent
Ashizawa et al.

(10) Patent No.: US 6,876,587 B2
(45) Date of Patent: Apr. 5, 2005

(54) SEMICONDUCTOR MEMORY DEVICE

(75) Inventors: Tetsuo Ashizawa, Kawasaki (JP); Wataru Yokozeki, Kunitachi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/694,402

(22) Filed: Oct. 28, 2003

(65) Prior Publication Data

US 2004/0190323 A1 Sep. 30, 2004

(30) Foreign Application Priority Data

Oct. 29, 2002 (JP) ........................................ 2002-314567

(51) Int. Cl.[7] ................................................. G11C 7/00
(52) U.S. Cl. ........................ 365/191; 365/233; 365/200
(58) Field of Search ................................ 365/191, 200, 365/210, 233, 203.03, 230.06, 230.08

(56) References Cited

U.S. PATENT DOCUMENTS 5,550,781 A * 8/1996 Sugawara et al. ........... 365/222
2004/0114424 A1 * 6/2004 Yoshida ....................... 365/154

FOREIGN PATENT DOCUMENTS

| JP | 11-096768 | 4/1999 |
|----|-----------|--------|
| JP | 11-203873 | 7/1999 |

* cited by examiner

*Primary Examiner*—Gene N. Auduong
(74) *Attorney, Agent, or Firm*—Arent Fox PLLC

(57) ABSTRACT

A semiconductor memory device comprises a memory cell array, a decoder unit selecting a word line of the memory cell array, a first dummy cell array connected to a first dummy bit line and disposed with the memory cell array at a first location away from the decoder unit along the word line, a second dummy cell array connected to second dummy bit lines and disposed with the memory cell array at a second location away from the decoder unit along the word line, the second location being farther from the decoder unit than the first location, and a timing control unit determining timing of activation and deactivation of an internal control signal.

12 Claims, 7 Drawing Sheets

SEMICONDUCTOR MEMORY DEVICE

CROSS-REFERENCE TO RELATED APPLICATIONS

This application is based upon and claims the benefit of priority from the prior Japanese patent application No. 2002-314567, filed on Oct. 29, 2002, the entire contents of which are incorporated herein by reference.

BACKGROUND OF THE INVENTION

1. Field of the Invention

The present invention relates to a semiconductor memory device which uses a self-timed method.

2. Description of the Related Art

A semiconductor memory device that uses a self-timed method to determine the timing of an internal control signal is known. In such a memory device, the timing of the internal control signal is determined based on a signal which has passed through a signal path including a read-out circuit, dummy memory cells and a selection circuit having a load equivalent to that of a read-out operation of usual memory cells.

In the self-timed method, the timing of the internal control signal is determined by canceling the variations of the characteristics of the memory cells in the semiconductor memory device due to the process variations by using the signal passing the corresponding dummy cell.

The self-timed method is used to determine the timing of various internal control signals, such as the word line select signal, the sense amplifier activation signal (in a case of the semiconductor memory device with the sense amplifier), and the data latch activation signal (in a case of the semiconductor memory device without the sense amplifier).

In the following, a description will be given of a conventional method of determining the timing of the data latch activation signal in the case of the semiconductor memory device having no sense amplifier (e.g., SRAM) as an example. However, the same method is applicable for the sense amplifier activation signal or the other signals, as well as the data latch activation signal.

FIG. 1 shows an example composition of a conventional semiconductor memory device for generating an internal control signal. FIG. 2 is a timing chart for explaining the method of determining the timing of the internal control signal in the conventional semiconductor memory device of FIG. 1.

As shown in FIG. 1, the semiconductor memory device 10 includes a dummy cell array 11, a memory cell array 12, a decoder 13, an I/O (input/output) latch circuit 14, and a timing control circuit 15. For example, the semiconductor memory device 10 is an SRAM having no sense amplifier, which uses the conventional self-timed method.

In the semiconductor memory device 10 of FIG. 1, the dummy cell array 11 is disposed with the memory cell array 12 at the location farthest from the decoder 13. In this case, the timing of the data latch activation signal is determined as follows.

As indicated by the arrow in FIG. 1, the timing control circuit 15 determines the timing of the data latch activation signal, which is inputted to a corresponding output latch portion of the I/O latch circuit 14, based on a signal which has passed a dummy bit line through a corresponding dummy cell of the dummy cell array 11 connected to the word line selected by the decoder 13. In the corresponding output latch portion, the data of the corresponding memory cell in the memory cell array 12 is read out in response to the determined activation timing.

In FIG. 2, (1) indicates the state of the clock signal "CK" outputted to each circuit of the semiconductor memory device 10, (2) indicates the state of the selected word line signal "WL", (3) indicates the state of the signal "stf" passing the dummy bit line through the corresponding dummy cell, and (4) indicates the state of the data latch activation signal "OUTPUT LATCH ENABLE" inputted to the corresponding output latch portion.

In this case, as shown in FIG. 2, the timing of the data latch activation signal (the rising edge of OUTPUT LATCH ENABLE) is determined by the rising edge of the signal "stf" from the corresponding dummy cell. Moreover, the timing of the data latch deactivation signal (the falling edge of OUTPUT LATCH ENABLE) is preset to an instant after a fixed time internal from the timing of the data latch activation signal according to the time delay of a set of inverters provided in the dummy bit line.

FIG. 3 shows another example composition of a conventional semiconductor memory device for generating an internal control signal.

As shown in FIG. 3, the semiconductor memory device 10A includes a dummy cell array 11A, the memory cell array 12, the decoder 13, the I/O latch circuit 14, and a timing control circuit 15A. For example, the semiconductor memory device 10A is an SRAM having no sense amplifier, which uses the conventional self-timed method.

In the semiconductor memory device 10A of FIG. 3, the dummy cell array 11A is disposed with the memory cell array 12 at the location nearest to the decoder 13. In this case, the timing of the data latch activation signal is determined as follows.

As indicated by the arrow in FIG. 3, the timing control circuit 15A determines the timing of the data latch activation signal, which is inputted to a corresponding output latch portion of the I/O latch circuit 14, based on a signal which has passed a dummy bit line through a corresponding dummy cell of the dummy cell array 11A connected to the word line selected by the decoder 13. In the corresponding output latch portion, the data reading of the corresponding memory cell in the memory cell array 12 is started in response to the determined activation timing.

In this case, the timing of the data latch activation signal is determined by the rising edge of the signal "stf" from the corresponding dummy cell, similar to the example of FIG. 1. Moreover, the timing of the data latch deactivation signal is preset to an instant after a fixed time interval from the timing of the data latch activation signal according to the time delay of a set of inverters provided in the dummy bit line.

In addition, Japanese Laid-Open Patent Application No. 11-203873 discloses a semiconductor memory device in which changes in the amplitude of a data line at the time of reading operation are simulated by using dummy memory cells in order to generate an internal control signal. Japanese Laid-Open Patent Application No. 11-96768 discloses a semiconductor memory device in which a data read-out signal is output to a sense amplifier after a word line select signal is received.

In the example of FIG. 1, the corresponding dummy cell is disposed with the memory cell array 12 at the location farthest from the decoder 13, and the time the output signal of the corresponding dummy cell reaches the timing control circuit 15 is longer than the time the output signals of all the memory cells on the selected word line in the memory cell array 4 reach the timing control circuit 7. Therefore, the timing margin needed for the timing determination of the data latch activation signal is adequate.

However, the determined timing of the data latch activation signal may have an excessively large amount of the timing margin because the signal is delivered through the signal path indicated by the arrow in FIG. 1.

In the example of FIG. 3, the corresponding dummy cell is disposed with the memory cell array 12 at the location nearest to the decoder 13, and the timing of the data latch activation signal can be set to the minimum time for reading the data from the memory cell array 12.

Hence, in the example of FIG. 3, high-speed data reading is possible. However, it cannot be said that the signal path of the dummy cell array 11A in the example of FIG. 3 correctly simulates the selection signal path of the actual memory cells. The timing of the data latch deactivation signal is preset to an instant after a fixed time interval from the timing of the data latch activation signal according to the time delay of a set of inverters provided in the dummy bit line, and, when the variations of the logic circuits do not accord with the variations of the characteristics of the memory cells, the timing margin needed for the timing determination of the data latch activation signal is likely to be inadequate.

The timing margin for the timing determination of the internal control signal in the example of FIG. 1 is adequately large, but the example of FIG. 1 is not suitable to attain high-speed data reading. Moreover, in the example of FIG. 3, high-speed data reading is possible but there is the possibility that the timing margin would be inadequate.

SUMMARY OF THE INVENTION

An object of the present invention is to provide an improved semiconductor memory device in which the above-mentioned problems are eliminated.

Another object of the:present invention is to provide a semiconductor memory device that provides a proper timing margin for the timing determination of an internal control signal and enables high-speed generation of an internal control signal so that the above-mentioned problems are eliminated.

The above-mentioned objects of the present invention are achieved by a semiconductor memory device comprising: a memory cell array; a decoder unit selecting a word line of the memory cell array; a first dummy cell array connected to a first dummy bit line and disposed with the memory cell array at a first location away from the decoder unit along the word line; a second dummy cell array connected to second dummy bit lines and disposed with the memory cell array at a second location away from the decoder unit along the word line, the second location being farther from the decoder unit than the first location; and a timing control unit determining timing of activation and deactivation of an internal control signal, wherein the timing control unit determines the timing of activation of the internal control signal based on a first signal passing the first dummy bit line through a corresponding dummy cell of the first dummy cell array, and determines the timing of deactivation of the internal control signal based on a second signal passing the second dummy bit line through a corresponding dummy cell of the second dummy cell array.

In the semiconductor memory device of the present invention, the first dummy cell array and the second dummy cell array are connected to the dummy bit line pairs and disposed with the memory cell array at the two respective locations which are different in the distance from the decoder unit in the direction of the word lines. The timing of activation of the internal control signal is determined based on the first signal from the corresponding dummy cell of the first dummy cell array. According to the semiconductor memory device of the present invention, it is possible to avoid the setting of an excessive timing margin as in the conventional device. Therefore, it is possible to attain high-speed data reading.

Moreover, the timing of deactivation of the internal control signal is determined based on the second signal from the corresponding dummy cell of the second dummy cell array. Hence, the semiconductor memory device of the present invention has no problem that the timing margin would be inadequate as in the conventional device.

Furthermore, the optimal timing for the data latch deactivation can be determined even if the composition of the memory cell array is varied, because the timing of deactivation of the internal control signal is determined based on the second signal from the corresponding dummy cell of the second dummy cell array.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of preferred embodiments of the present invention with reference to the accompanying drawings.

Figure 4:
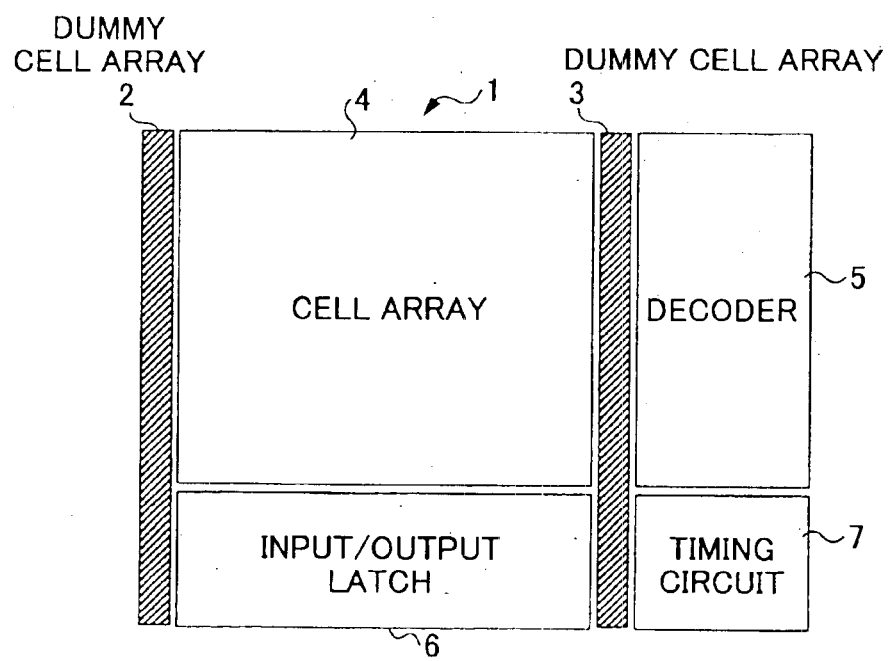
FIG. 4 is a block diagram of a semiconductor memory device of a first preferred embodiment of the present invention.
Figure 5:
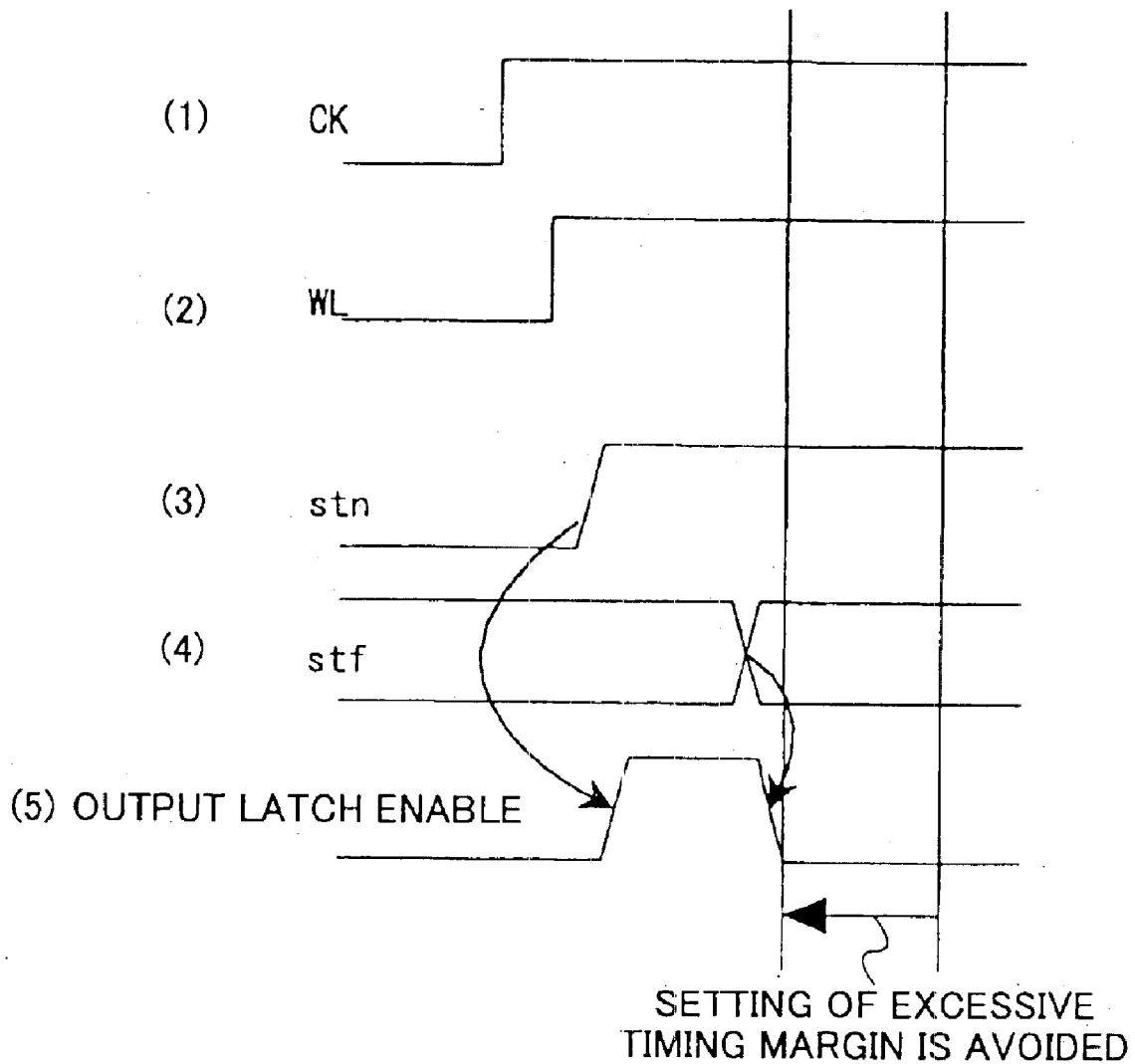
FIG. 5 is a timing chart for explaining the method of determining the timing of an internal control signal in the semiconductor memory device of FIG. 4.

FIG. 4 shows the semiconductor memory device of the first preferred embodiment of the present invention. FIG. 5 is a timing chart for explaining the method of determining the timing of an internal control signal in the semiconductor memory device of FIG. 4.

The semiconductor memory device 1 of FIG. 4 includes a first dummy cell array 2, a second dummy cell array 3, a memory cell array 4, a decoder unit 5, an I/O latch circuit 6, and a timing control circuit 7. For example, the semiconductor memory device 1 is an SRAM having no sense amplifier, which uses the self-timed method according to the present invention.

The first dummy cell array 2 is connected to the dummy bit line pairs and disposed with the memory cell array 4 at the location farthest from the decoder unit 5. The second dummy cell array 3 is connected to the dummy bit line pairs and disposed with the memory cell array 4 at the location nearest to the decoder unit 5.

The timing of the data latch activation signal in the present embodiment is determined as follows.

That is, the timing control circuit 7 determines the timing of the data latch activation signal, which is inputted to a corresponding output latch portion of the I/O latch circuit 6, based on a signal passing a dummy bit line through a corresponding dummy cell of the second dummy cell array 3 connected to the word line selected by the decoder unit 5. In the corresponding output latch portion, the data reading of the corresponding memory cell in the memory cell array 4 is started in response to the determined activation timing.

The timing of the data latch deactivation signal in the present embodiment is determined as follows.

That is, the timing control circuit 7 determines the timing of the data latch deactivation signal, which is inputted to the corresponding output latch portion of the I/O latch circuit 6, based on a signal passing a dummy bit line through a corresponding dummy cell of the first dummy cell array 2 connected to the word line selected by the decoder unit 5. In the corresponding output latch portion, the data reading of the corresponding memory cell in the memory cell array 4 is finished in response to the determined deactivation timing.

In FIG. 5, (1) indicates the state of the clock signal "CK" outputted to each circuit of the semiconductor memory device 1, (2) indicates the state of the selected word line signal WL, (3) indicates the state of the signal "stn" passing the dummy bit line through the corresponding dummy cell of the second dummy cell array 3, (4) indicates the state of the signal "stf" passing the dummy bit line through the corresponding dummy cell of the first dummy cell array 2, and (5) indicates the state of the data latch activation signal "OUTPUT LATCH ENABLE" inputted to the corresponding output latch portion of the I/O latch circuit 6.

In the semiconductor memory device 1 of the present embodiment, as shown in FIG. 4, the first dummy cell array 2 and the second dummy cell array 3 are connected to the dummy bit line pairs and disposed with the memory cell array 4 at the two respective locations which are different in the distance from the decoder unit 5 in the direction of the word lines.

As shown in FIG. 5, the timing of the data latch activation signal (the rising edge of OUTPUT LATCH ENABLE) is determined by the rising edge of the signal "stn" passing the dummy bit line through the corresponding dummy cell in the second dummy cell array 3, and the timing of the data latch deactivation signal (the falling edge of OUTPUT LATCH ENABLE) is determined by the rising edge of the signal "stf" passing the dummy bit line through the corresponding dummy cell in the first dummy cell array 2.

Figure 1:
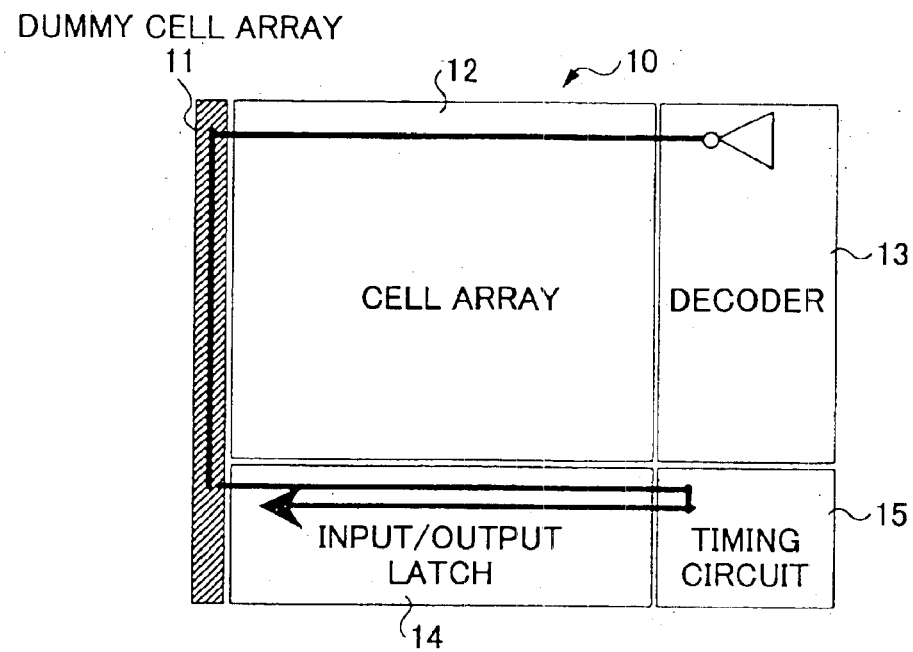
FIG. 1 is a block diagram of an example composition of a conventional semiconductor memory device for generating an internal control signal.
Figure 2:
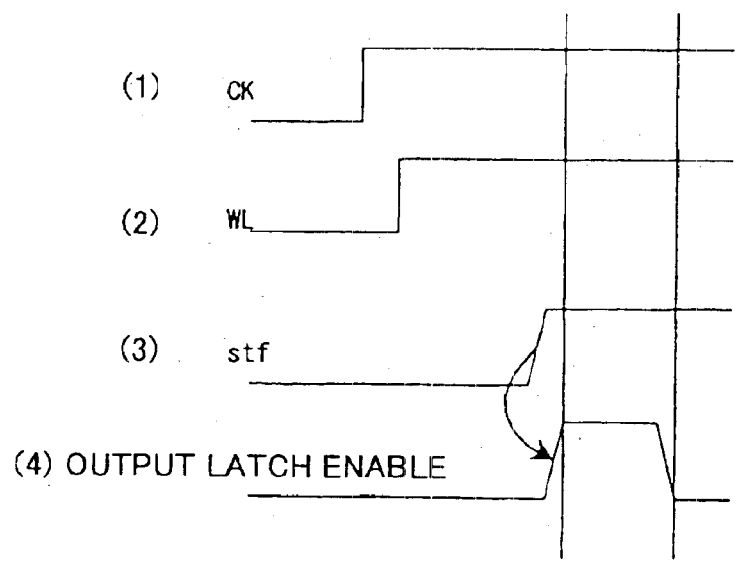
FIG. 2 is a timing chart for explaining the method of determining the timing of an internal control signal in the conventional device of FIG. 1.

In the semiconductor memory device 1 of the present embodiment, the timing of the data latch activation signal is determined based on the signal "stn" from the corresponding dummy cell of the second dummy cell array 3 that is disposed at the location nearest to the decoder unit 5, and the setting of an excessive timing margin as in the conventional example of FIG. 1 is avoided. Therefore, it is possible to attain high-speed data reading.

Figure 3:
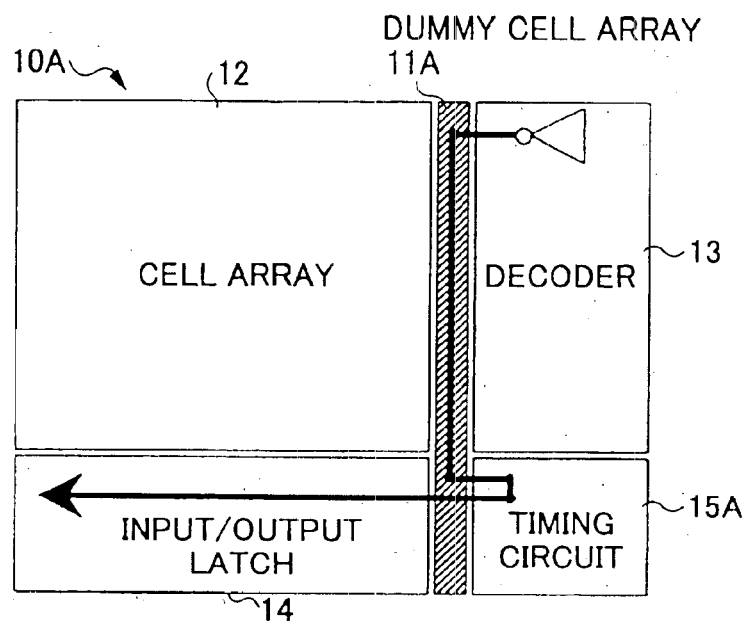
FIG. 3 is a block diagram of another example composition of the conventional semiconductor memory device for generating an internal control signal.

Moreover, the timing of the data latch deactivation signal is determined based on the signal "stf" from the corresponding dummy cell of the first dummy cell array 2 that is disposed at the location farthest from the decoder unit 5. The time the output signal of the corresponding dummy cell of the first dummy cell array 2 reaches the timing control circuit 7 is longer than the time the output signals of the memory cells on the selected word line in the memory cell array 4 reach the timing control circuit 7. Therefore, the present embodiment has no problem that the timing margin would be inadequate as in the conventional example of FIG. 3.

Furthermore, the optimal timing for the data latch deactivation can be determined even if the composition of the memory cell array 4 is varied, because the timing of the data latch deactivation signal is determined based on the signal "stf" from the corresponding dummy cell of the first dummy cell array 2 disposed at the farthest location.

Figure 6:
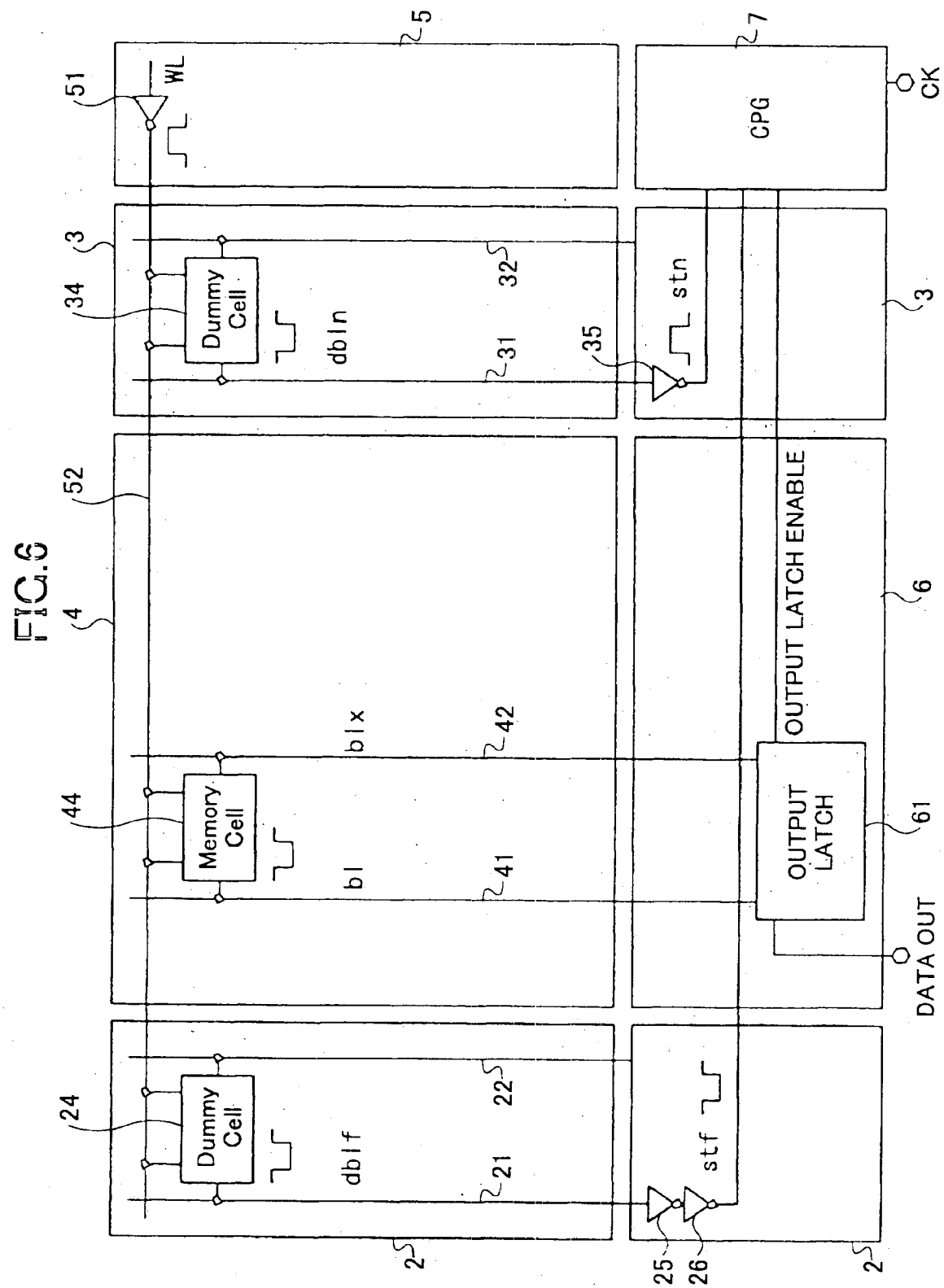
FIG. 6 is a diagram for explaining the dummy bit lines and the dummy cells in the semiconductor memory-device of FIG. 4.

FIG. 6 shows the dummy bit lines and the dummy cells in the semiconductor memory device of FIG. 4.

As shown in FIG. 6, the first dummy cell array 2 is connected to the dummy bit line pairs 21 and 22 and disposed with the memory cell array 4 at the location farthest from the decoder unit 5. The second dummy cell array 3 is connected to the dummy bit line pairs 31 and 32 and disposed with the memory cell array 4 at the location nearest to the decoder unit 5.

It is supposed that the decoder 51 is provided in the decoder unit 5 on a selected word line 52. Moreover, the dummy cell 24 of the first dummy cell array 2, the dummy cell 34 of the second dummy cell array 3, and the memory cell 44 of the memory cell array 4 are connected to the selected word line 52. The dummy bit line 21 to which the dummy cell 24 is connected is connected to the pair of inverters 25 and 26 connected in series. The inverter 35 is connected to the dummy bit line 31 to which the dummy cell 34 is connected. The memory cell 44 is connected to the pair of the bit lines 41 and 42, and these bit lines 41 and 42 are connected to the output latch portion 61 of the I/O latch circuit 6.

Alternatively, the composition of FIG. 6 may be modified such that an odd number of inverters are connected in series on the dummy bit line 31 to which the dummy cell array 3 is connected, and an even number of inverters are connected in series on the dummy bit line 21 to which the dummy cell array 2 is connected.

The timing control circuit 7 determines the timing of the data latch activation signal "OUTPUT LATCH ENABLE", which is inputted to the output latch portion 61 of the I/O latch circuit 6, based on the signal "stn" passing the dummy bit line 31 through the dummy cell 34 of the second dummy cell array 3 (the dummy cell 34 being connected to the word line 52 selected by the decoder 51) and sent to the timing control circuit 7.

In the output latch portion 61, the data reading of the memory cell 44 in the memory cell array 4 is started in response to the determined activation timing. The output data "DATA OUT", read from the memory cell 44 on the selected word line 52, is outputted from the output latch portion 61.

Moreover, the timing control circuit 7 determines the timing of the data latch deactivation signal "OUTPUT LATCH ENABLE", which is inputted to the output latch portion 61 of the I/O latch circuit 6, based on the signal "stf" passing the dummy bit line 21 through the dummy cell 24 of the first dummy cell array 2 (the dummy cell 24 being connected to the word line 52 selected by the decoder 51) and sent to the timing control circuit 7.

In the output latch portion 61, the data reading of the memory cell 44 of the memory cell array 4 is finished in response to the determined deactivation timing.

In the present embodiment, the timing control circuit 7 of FIG. 6 is provided with a clock pulse generator circuit (CPG), and the above-described function of the timing control circuit 7 is realized by using this clock pulse generator circuit (CPG), which will be described later.

Figure 7:
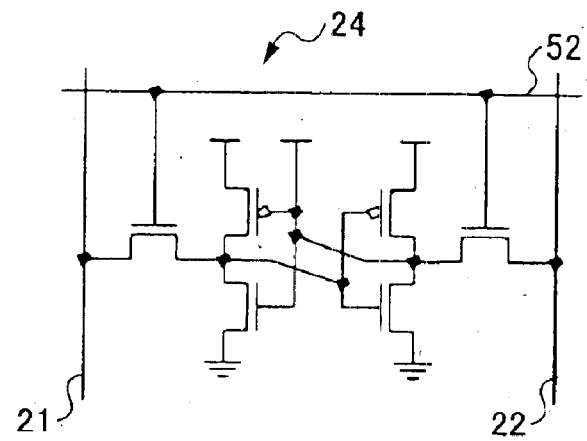
FIG. 7 is a circuit diagram of a dummy cell provided in the semiconductor memory device of FIG. 6.

FIG. 7 shows the dummy cell 24 provided in the semiconductor memory device of FIG. 6.

As shown in FIG. 7, the dummy cell 24 is connected to the word line 52 and the pair of the dummy bit lines 21 and 22. The first dummy cell array 2 is formed by connecting a plurality of dummy cells, each of which is the same as the dummy cell 24, to the pair of the dummy bit lines 21 and 22 and arraying such dummy cells in a row along the dummy bit lines 21 and 22.

Similarly, the dummy cell 34, which is provided in the same manner as the dummy cell 24 of FIG. 7, is connected to the word line and the pair of the dummy bit lines 31 and 32. The second dummy cell array 3 is formed by connecting a plurality of dummy cells, each of which is the same as the dummy cell 34, to the pair of the dummy bit lines 31 and 32 and arraying such dummy cells in a row along the dummy bit lines 31 and 32.

Figure 8:
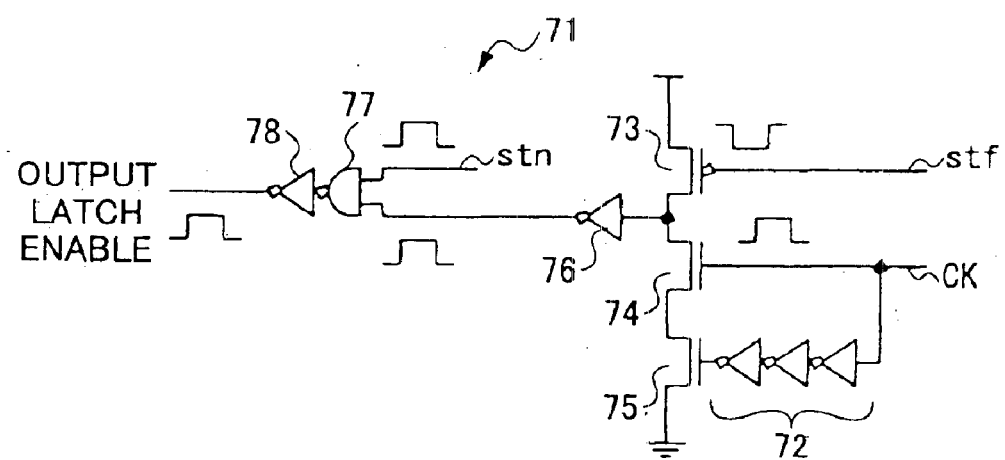
FIG. 8 is a circuit diagram of a clock pulse generator circuit in the semiconductor memory device of FIG. 6.

FIG. 8 shows a clock pulse generator circuit (CPG) 71 provided in the timing control circuit 7 of the semiconductor memory device of FIG. 6.

As shown in FIG. 8, the clock pulse generator circuit 71 includes a set of inverters 72, a transistor 73, a transistor 74, a transistor 75, an inverter 76, an NAND circuit 77, and an inverter 78. The transistor 73 has the gate to which the signal "stf" from the first dummy cell array 2 is supplied. The transistor 74 has the gate to which the clock signal "CK" is supplied. The transistor 75 has the gate to which the output of the final-stage inverter in the inverter sequence 72 is connected. The inverter 76 has the input connected to the connection point of the transistor 73 and the transistor 74. The NAND circuit 77 has the input to which the signal "stn" from the second dummy cell array 3 is supplied, and the input to which the output of the inverter 76 is connected. The inverter 78 has the input to which the output of the NAND circuit 77 is connected.

In the semiconductor memory device of FIG. 6, the above-described clock pulse generator circuit 71 receives the input signals "stf" and "stn" from the dummy cell arrays 2 and 3, and outputs the data latch activation signal "OUTPUT LATCH ENABLE" to the output latch portion 61 as an output of the inverter 78.

Figure 9:
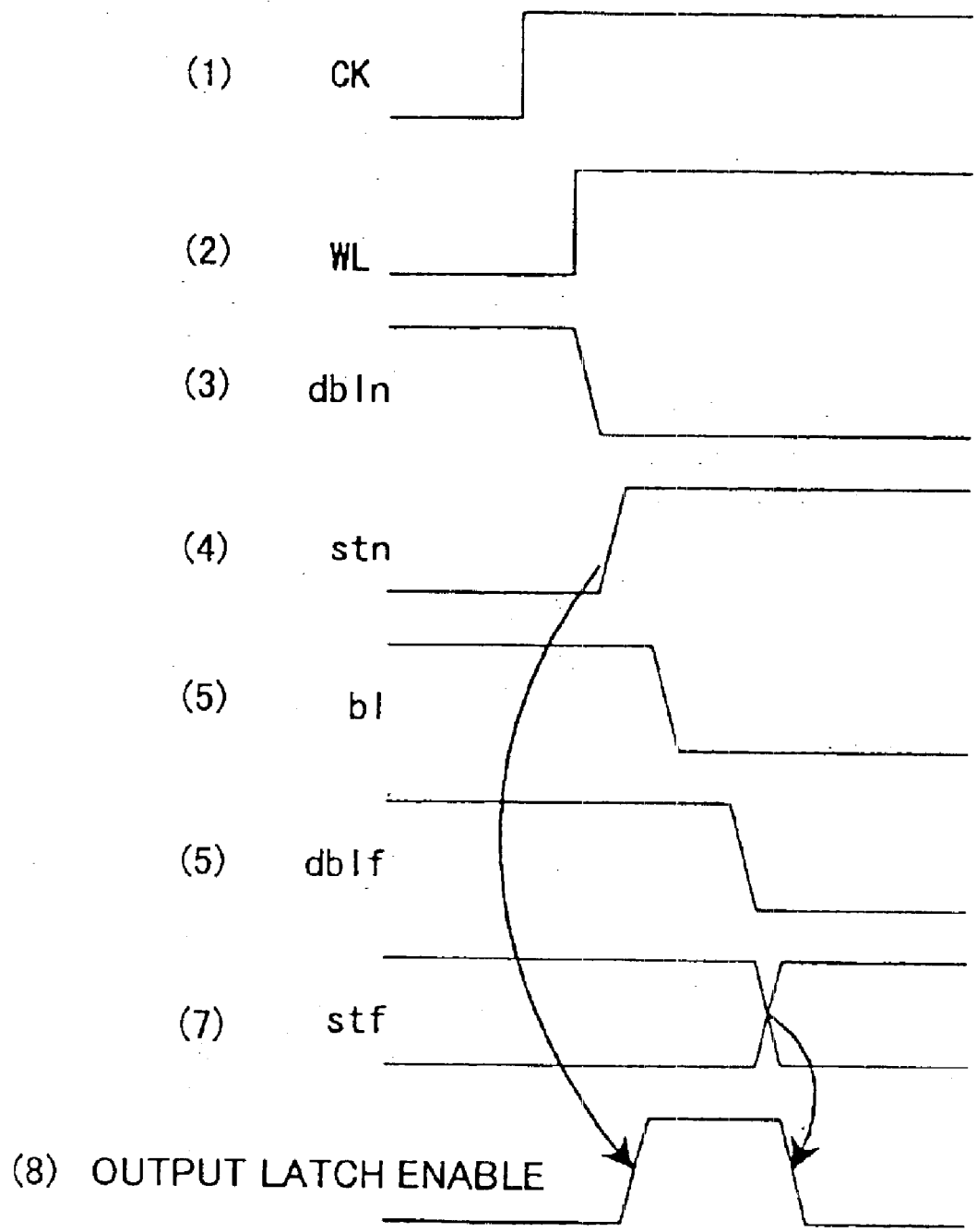
FIG. 9 is a timing chart for explaining the method of determining the timing of an internal control signal in the semiconductor memory device of FIG. 6.

FIG. 9 is a timing chart for explaining the method of determining the timing of an internal control signal in the semiconductor memory device of FIG. 6.

In FIG. 9, (1) indicates the state of the clock signal "CK" outputted to each circuit of the semiconductor memory device 1, (2) indicates the state of the selected word line signal "WL", (3) indicates the state of the signal "dbln" sent to the dummy bit line 31 from the dummy cell 34 of the second dummy cell array 3, (4) indicates the state of the signal "stn" passing the dummy bit line 31 through the dummy cell 34 of the second dummy cell array 3 and outputted from the inverter 35 to the CPG 71, (5) indicates the state of the data signal "bl" sent to the bit line 41 from the memory cell 44 of the memory cell array 4, (6) indicates the state of the signal "dblf" sent to the dummy bit line 21 from the dummy cell 24 of the first dummy cell array 2, (7) indicates the state of the signal "stf" passing the dummy bit line 21 through the dummy cell 24 of the first dummy cell array 2 and outputted from the inverters 25 and 26 to the CPG 71, and (8) indicates the state of the data latch activation signal "OUTPUT LATCH ENABLE" inputted to the output latch portion 61 of the I/O latch circuit 6 from the CPG 71.

As shown in FIG. 9, upon receipt of the signal "stn" at the clock pulse generator circuit (CPG) 71, the CPG 71 determines the rising edge of the signal OUTPUT LATCH ENABLE by the rising edge of the signal "stn", and then, upon receipt of the signal "stf" at the CPG 71, the CPG 71 determines the falling edge of the signal OUTPUT LATCH ENABLE by the rising edge of the signal "stf".

Next, a description will be given of the semiconductor memory device of the second preferred embodiment of the present invention with reference to FIG. 10.

Figure 10:
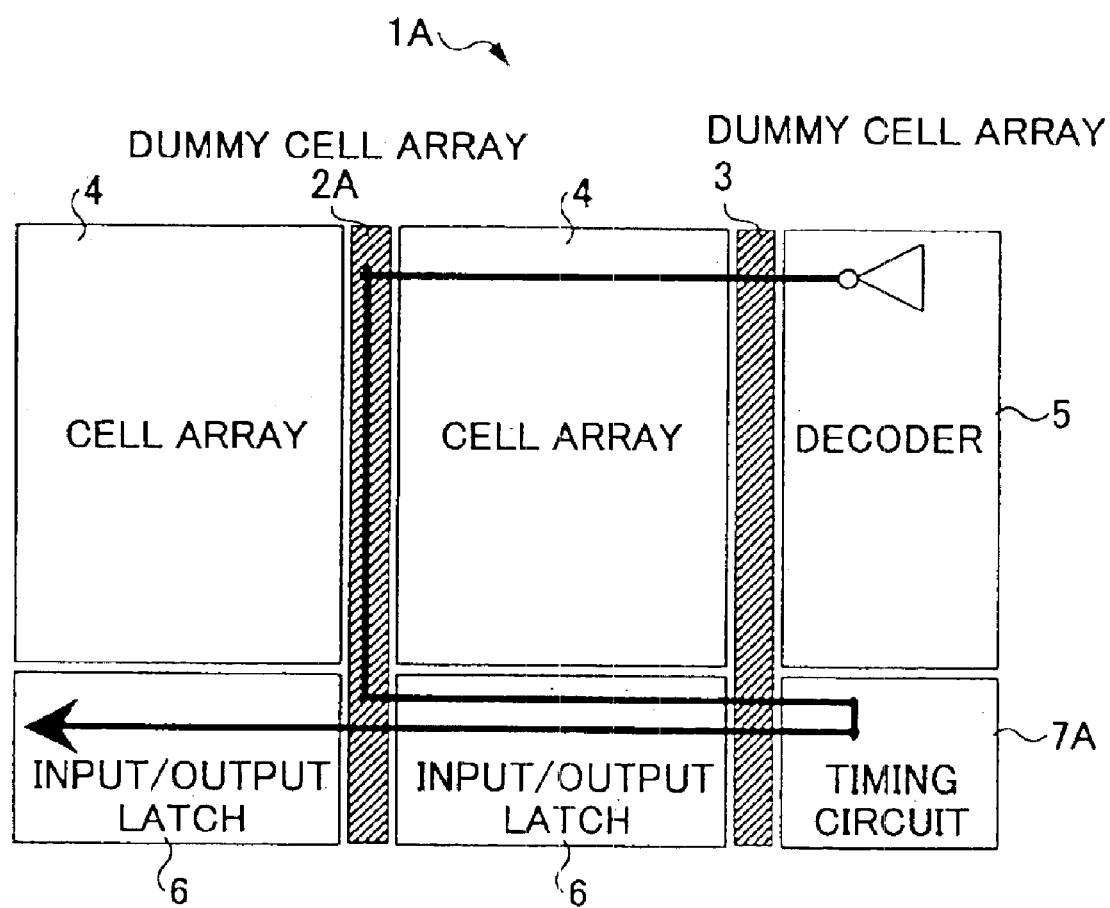
FIG. 10 is a block diagram of a semiconductor memory device of a second preferred embodiment of the present invention.

FIG. 10 shows the semiconductor memory device 1A of the second preferred embodiment. In FIG. 10, the elements which are essentially the same as corresponding elements in FIG. 4 are designated by the same reference numerals, and a description thereof will be omitted.

The semiconductor memory device 1A of FIG. 10 includes a first dummy cell array 2A, the second dummy cell array 3, the memory cell array 4, the decoder unit 5, the I/O latch circuit 6, and a timing control circuit 7A. For example, the semiconductor memory device 1A is an SRAM having no sense amplifier, which uses the self-timed method according to the present invention.

The first dummy cell array 2A is connected to the dummy bit line pairs and disposed with the memory cell array 4 nearly at the central location of the memory cell array. The second dummy cell array 3 is connected to the dummy bit line pairs and disposed with the memory cell array 4 at the location nearest to the decoder unit 5. Except the first dummy cell array 2A and the timing control circuit 7A, the semiconductor memory device 1A of this embodiment is configured in the same manner as the semiconductor memory device 1 of the previous embodiment as in the composition of FIG. 6.

The timing of the data latch activation signal in the present embodiment is determined as follows.

That is, the timing control circuit 7A determines the timing of the data latch activation signal, which is inputted to a corresponding output latch portion of the I/O latch circuit 6, based on a signal passing the dummy bit line through a corresponding dummy cell in the second dummy cell array 3 connected to the word line selected by the decoder unit 5. In the corresponding output latch portion, the data reading of the corresponding memory cell in the memory cell array 4 is started in response to the determined activation timing.

The timing of the data latch deactivation signal in the present embodiment is determined as follows.

That is, the timing control circuit 7A determines the timing of the data latch deactivation signal, which is inputted to the corresponding output latch portion of the I/O latch circuit 6, based on a signal passing the dummy bit line through a corresponding dummy cell in the first dummy cell array 2A connected to the word line selected by the decoder unit 5. In the corresponding output latch portion, the data reading of the corresponding memory cell in the memory cell array 4 is finished in response to the determined deactivation timing.

In the embodiment of FIG. 10, the first dummy cell array 2A is disposed nearly at the central location of the memory cell array 4. As indicated by the arrow in FIG. 10, the output signal of the corresponding dummy cell of the first dummy cell array 2A is delivered forward and backward through the signal path that has nearly half the length of all the I/O blocks of the I/O latch circuit 6 in the direction of the word line. The instant the output signal of the corresponding dummy cell reaches the timing control circuit 7A is later than the instant the output signal of a corresponding memory cell of the memory cell array 4 at the location farthest from the decoder unit 5 reaches the timing control circuit 7A.

Therefore, it is possible to provide an adequate timing margin also for such location of the first dummy cell array 2A. However, disposing the first dummy cell array 2A exactly at the central location of the memory cell array 4 is not necessarily required. If the first dummy cell array 2A is disposed at a longer distance from the decoder unit 5, a larger timing margin will be obtained.

In the above-described embodiments, the method of determining the timing of the data latch activation signal in the case of the semiconductor memory device having no sense amplifier (SRAM etc.) has been explained. However, the present invention is also applicable to the sense amplifier activation signal or other internal control signals in the case of the semiconductor memory device with the sense amplifier.

The present invention is not limited to the above-described embodiments, and variations and modifications may be made without departing from the scope of the present invention.

What is claimed is:

1. A semiconductor memory device, comprising:
   a memory cell array;
   a decoder unit selecting a word line of the memory cell array;
   a first dummy cell array connected to a first dummy bit line and disposed with the memory cell array at a first location away from the decoder unit along the word line;
   a second dummy cell array connected to a second dummy bit line and disposed with the memory cell array at a second location away from the decoder unit along the word line, the second location being farther from the decoder unit than the first location;
   a timing control unit determining timing of activation and deactivation of an internal control signal, wherein the timing control unit determines the timing of activation of the internal control signal based on a first signal passing the first dummy bit line through a corresponding dummy cell of the first dummy cell array, and determines the timing of deactivation of the internal control signal based on a second signal passing the second dummy bit line through a corresponding dummy cell of the second dummy cell array.

2. The semiconductor memory device of claim 1 wherein the first dummy cell array is disposed at a location nearest to the decoder unit, and the second dummy cell array is disposed at a location farthest from the decoder unit.

3. The semiconductor memory device of claim 2 wherein the timing control unit is provided to determine activation timing of a data latch signal, inputted to a corresponding output latch portion of an I/O latch circuit, based on an output signal of a corresponding dummy cell of the first dummy cell array.

4. The semiconductor memory device of claim 2 wherein the timing control unit is provided to determine deactivation timing of a data latch signal, inputted to a corresponding output latch portion of an I/O latch circuit, based on an output signal of a corresponding dummy cell of the second dummy cell array.

5. The semiconductor memory device of claim 1 wherein the semiconductor memory device is an SRAM having no sense amplifier.

6. The semiconductor memory device of claim 1 wherein the first dummy cell array is disposed at a location nearest to the decoder unit, and the second dummy cell array is disposed nearly at a central location of the memory cell array.

7. The semiconductor memory device of claim 6 wherein the timing control unit is provided to determine activation timing of a data latch signal, inputted to a corresponding output latch portion of an I/O latch circuit, based on an output signal of a corresponding dummy cell of the first dummy cell array.

8. The semiconductor memory device of claim 6 wherein the timing control unit is provided to determine deactivation timing of a data latch signal, inputted to a corresponding output latch portion of an I/O latch circuit, based on an output signal of a corresponding dummy cell of the second dummy cell array.

9. The semiconductor memory device of claim 2 further comprising an odd number of inverters connected in series on the first dummy bit line to which the first dummy cell array is connected, and an even number of inverters connected in series on the second dummy bit line to which the second dummy cell array is connected.

10. The semiconductor memory device of claim 6 further comprising an odd number of inverters connected in series on the first dummy bit line to which the first dummy cell array is connected, and an even number of inverters connected in series on the second dummy bit line to which the second dummy cell array is connected.

11. The semiconductor memory device of claim 1 wherein the internal control signal is supplied to an I/O latch circuit, and the timing control unit determines activation and deactivation timing of a data latch signal which is inputted to the I/O latch circuit.

12. The semiconductor memory device of claim 1 wherein the internal control signal is supplied to a sense amplifier, and the timing control unit determines activation and deactivation timing of a sense amplifier activation signal which is inputted to the sense amplifier.

* * * * *